United States Patent
Jung et al.

(10) Patent No.: US 12,136,616 B2
(45) Date of Patent: Nov. 5, 2024

(54) LIGHT EMITTING DIODE MODULE AND DISPLAY DEVICE HAVING THE SAME

(71) Applicant: SAMSUNG ELECTRONICS CO., LTD., Suwon-si (KR)

(72) Inventors: Youngki Jung, Suwon-si (KR); Sangmin Shin, Suwon-si (KR); Jinho Kim, Suwon-si (KR); Chulgyu Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 626 days.

(21) Appl. No.: 17/070,417

(22) Filed: Oct. 14, 2020

(65) Prior Publication Data

US 2021/0111168 A1 Apr. 15, 2021

(30) Foreign Application Priority Data

Oct. 14, 2019 (KR) .................. 10-2019-0127144

(51) Int. Cl.
*H01L 29/10* (2006.01)
*H01L 23/00* (2006.01)
(Continued)

(52) U.S. Cl.
CPC ............ *H01L 25/167* (2013.01); *H01L 24/05* (2013.01); *H01L 24/24* (2013.01);
(Continued)

(58) Field of Classification Search
CPC ....... H01L 25/167; H01L 24/05; H01L 24/24; H01L 2224/02379; H01L 2224/02381;
(Continued)

(56) References Cited

U.S. PATENT DOCUMENTS

2014/0346481 A1 11/2014 Yamazaki et al.
2014/0367863 A1 12/2014 Yamamichi et al.
(Continued)

FOREIGN PATENT DOCUMENTS

KR 10-2015-0015606 A 2/2015
KR 10-2019-0053500 A 5/2019
(Continued)

OTHER PUBLICATIONS

International Search Report issued Jan. 27, 2021 by the International Searching Authority in counterpart international Patent application No. PCT/KR2020/013774.
(Continued)

*Primary Examiner* — Ismail A Muse
(74) *Attorney, Agent, or Firm* — Sughrue Mion, PLLC

(57) ABSTRACT

Provided are a light emitting diode (LED) module that enables a freedom in structure design thereof using a fan-out interconnection and an insulating layer, and a display device having the same. The LED module having a multi-layer structure includes substrate; a LED located on the substrate and emitting light toward the substrate; a plurality of upper electrodes located on the LED and connected to the LED; an upper insulating layer provided to surround the plurality of upper electrodes; a film on glass (FOG) electrode located on the upper insulating layer; and a fan out interconnection structure configured to connect the plurality of upper electrodes to the FOG electrode through the upper insulating layer.

20 Claims, 13 Drawing Sheets

(51) Int. Cl.
*H01L 25/16* (2023.01)
*H01L 29/76* (2006.01)
*H01L 31/036* (2006.01)
*H01L 31/112* (2006.01)

(52) U.S. Cl.
CPC .............. *H01L 2224/02379* (2013.01); *H01L 2224/02381* (2013.01); *H01L 2224/24146* (2013.01)

(58) Field of Classification Search
CPC ........... H01L 2224/24146; H01L 33/44; H01L 25/0753; H01L 33/62; H01L 27/156; H01L 27/124; H01L 33/38; G09F 9/33; G09G 3/32
See application file for complete search history.

(56) References Cited

U.S. PATENT DOCUMENTS

2015/0102487 A1* 4/2015 Wang ..................... H01L 23/31
257/737
2016/0343652 A1* 11/2016 Karpman ............ H01L 23/5226
2018/0204823 A1* 7/2018 Schwarz ............. H01L 25/0753
2018/0254226 A1 9/2018 Iguchi

FOREIGN PATENT DOCUMENTS

WO 2018/155284 A1 8/2018
WO 2019/093812 A1 5/2019

OTHER PUBLICATIONS

Communication issued Mar. 19, 2021 by the European Patent Office in counterpart European Patent Application No. 20200888.4.
Communication issued Oct. 24, 2022 by the European Patent Office for European Patent Application No. 20200888.4.

* cited by examiner

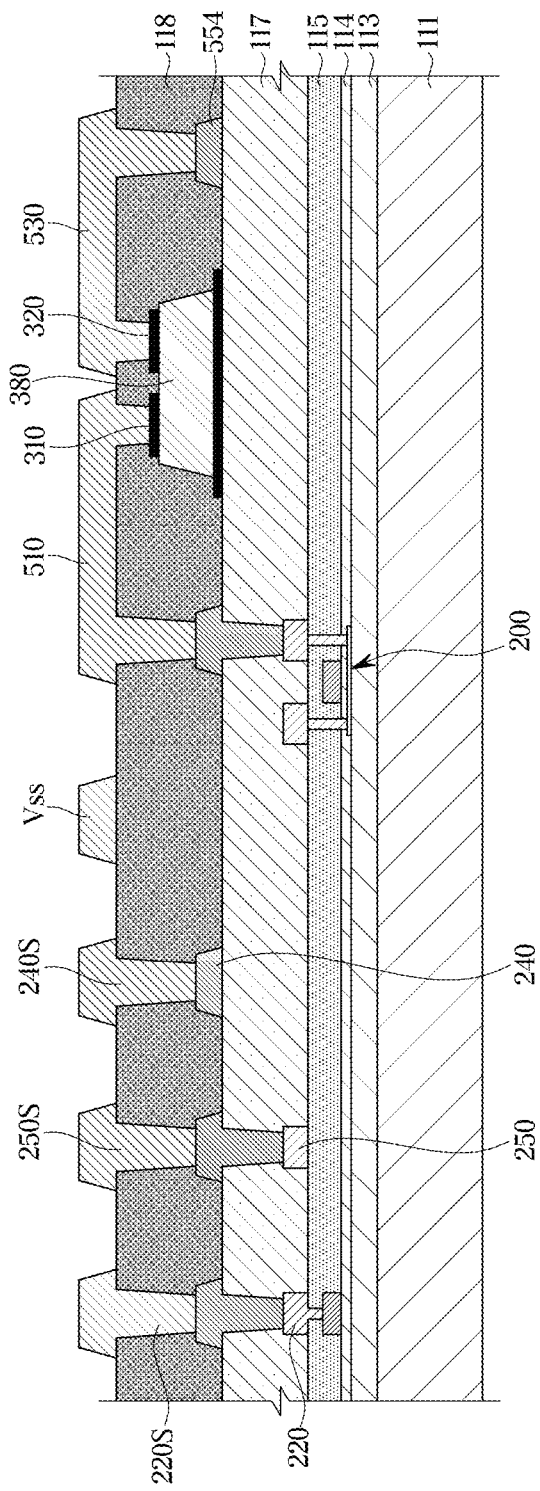

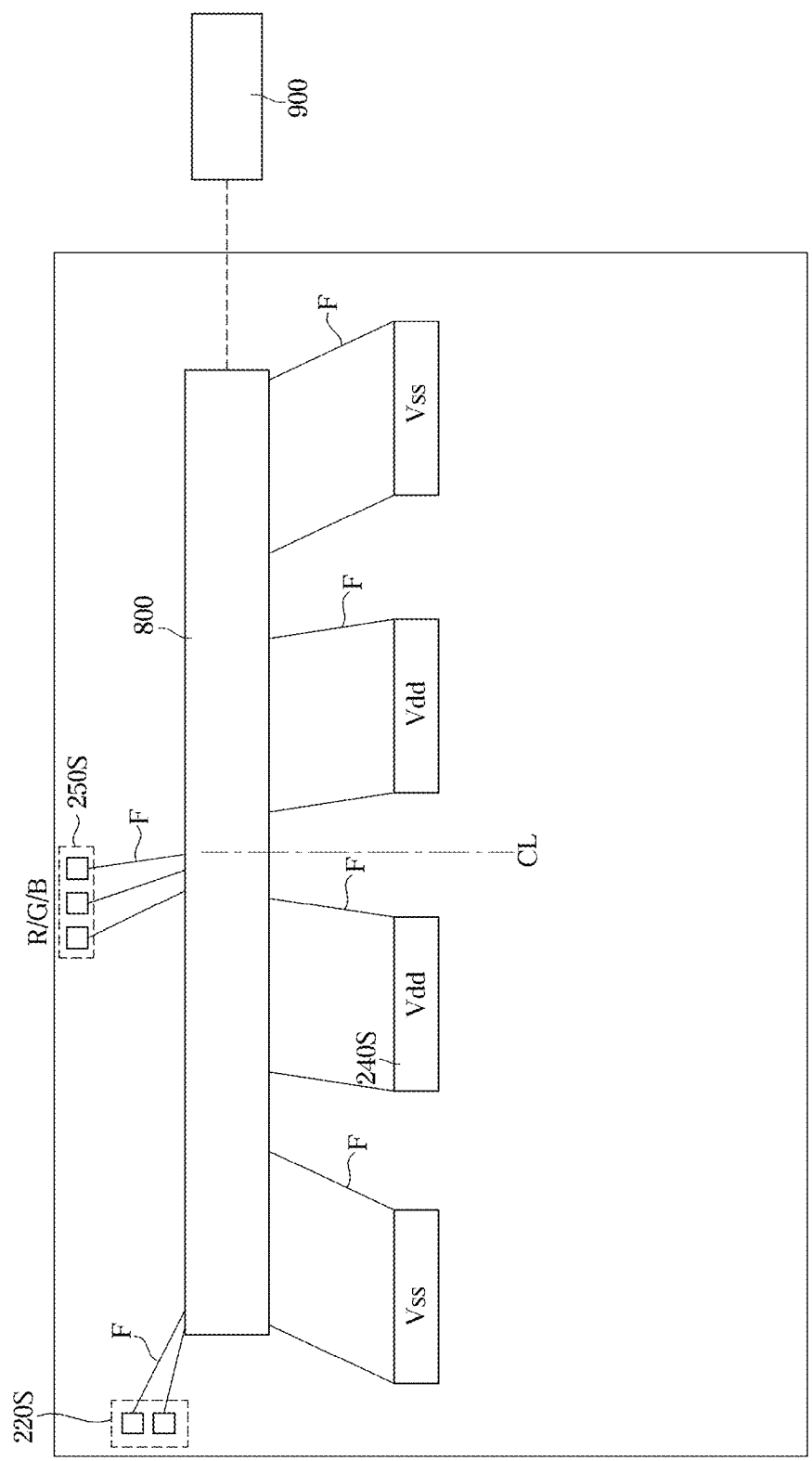

LIGHT EMITTING DIODE MODULE AND DISPLAY DEVICE HAVING THE SAME

CROSS-REFERENCE TO RELATED APPLICATION

This application is based on and claims priority under 35 U.S.C. § 119 to Korean Patent Application No. 2019-0127144, filed on Oct. 14, 2019 in the Korean Intellectual Property Office, the disclosure of which is incorporated herein by reference.

BACKGROUND

1. Field

The disclosure relates to a light-emitting diode (LED) module that displays an image using LEDs and a display device having the same.

2. Description of the Related Art

A display device is a device that converts electrical information into visual information and displays the visual information. The display device may not only include televisions and monitors, but also include portable devices, such as laptop personal computers (PCs), smart phones, tablet PCs, and wearable devices.

The display device may include a non-emissive display panel, such as a liquid crystal display (LCD), and an emissive display panel that generates light corresponding to a signal.

In order to implement an emissive display panel, light emitting diodes (LEDs) have been actively studied. LEDs are devices that convert electrical signals into forms of light, such as infrared rays and visible light using the characteristics of compound semiconductors, and are not only used for home appliances, remote controllers, electronic boards, and various automation devices, but also come into wide use, such as small handheld electronic devices and large display devices.

Recently, a micro light-emitting diode (microLED or μLED) display panel are used in display devices. The microLED display panel is a flat panel display and is composed of a plurality of inorganic LEDs having a size less than or equal to 100 micrometers. Compared to LCD panels that require backlight, microLED display panels provide better contrast, response time, and energy efficiency. Moreover, while both organic LEDs and microLEDs (inorganic LEDs) energy efficient, microLEDs have better brightness, luminous efficiency, and lifespan than OLEDs.

SUMMARY

Therefore, it is an object of the disclosure to provide a light emitting diode (LED) module enabling a freedom to structure design thereof using a fan-out interconnection and an insulating layer, and a display device having the same.

Additional aspects of the disclosure will be set forth in part in the description which follows and, in part, will be obvious from the description, or may be learned by practice of the disclosure.

According to an aspect of the disclosure, there is provided a light emitting diode (LED) module having a multi-layer structure, the LED module comprising: a substrate; a LED on the substrate, the LED configured to emit light toward the substrate; a plurality of upper electrodes on the LED and connected to the LED; an upper insulating layer surrounding the plurality of upper electrodes; a film on glass (FOG) electrode on the upper insulating layer; and a fan out interconnection structure configured to connect the plurality of upper electrodes to the FOG electrode through the upper insulating layer.

The upper insulating layer may be formed of a first layer different from a second layer on which the LED is mounted.

The upper insulating layer may be provided between the FOG electrode and the LED to protect the LED.

The upper insulating layer may include via holes corresponding to the plurality of upper electrodes.

The fan out interconnection structure may be formed separate from an interconnection structure connected to the LED.

The LED module may further comprise a thin film transistor (TFT) disposed on the substrate and having a gate electrode, wherein the plurality of upper electrodes comprise a first upper electrode connected to a signal electrode and a second upper electrode connected to the gate electrode, the signal electrode provided to supply a data signal to the LED, and wherein the FOG electrode connects the first and the second upper electrodes respectively connected to the signal electrode and the gate electrode to be connected to the FOG electrode through the fan out interconnection structure.

The plurality of upper electrodes may comprise a third upper electrode connected to a power voltage electrode that supplies power to the LED and a fourth upper electrode connected to a reference voltage electrode connected to a cathode of the LED, wherein the FOG electrode connects the third and the fourth upper electrodes respectively connected to the power voltage electrode and the reference voltage electrode to be connected to the FOG electrode through the fan out interconnection structure.

The fan out interconnection structure may respectively be connected to the power voltage electrode and the reference voltage electrode form a symmetric structure with respect to the FOG electrode.

According to another aspect of the disclosure, there is provided a display device comprising: a light emitting diode (LED) module having a multi-layer structure; a driver integrated chip (IC) configured to drive the LED module; a film on glass (FOG) electrode located on the LED module and configured to be connected to the driver IC; and a controller configured to supply power to the LED module through the driver IC, wherein the LED module includes: a substrate; a LED on the substrate, the LED configured to emit light toward the substrate; a plurality of upper electrodes on the LED and connected to the LED; an upper insulating layer surrounding the plurality of upper electrodes; a film on glass (FOG) electrode on the upper insulating layer; and a fan out interconnection structure configured to connect the plurality of upper electrodes to the FOG electrode through the upper insulating layer.

The upper insulating layer may be formed of a first layer different from a second layer on which the LED is mounted.

The upper insulating layer may be provided between the FOG electrode and the LED to protect the LED.

The upper insulating layer may include via holes corresponding to the plurality of upper electrodes.

The fan out interconnection structure may be formed separate from an interconnection structure connected to the LED.

The display device may further comprise a thin film transistor (TFT) disposed on the substrate and having a gate electrode, wherein the plurality of upper electrodes comprise a first upper electrode connected to a signal electrode and a second upper electrode connected to the gate electrode, the signal electrode provided to supply a data signal to the LED, and wherein the FOG electrode connects the first and the second upper electrodes respectively connected to the signal electrode and the gate electrode to be connected to the FOG electrode through the fan out interconnection structure.

The plurality of upper electrodes may comprise a third upper electrode connected to a power voltage electrode that supplies power to the LED and a fourth upper electrode connected to a reference voltage electrode connected to a cathode of the LED, wherein the FOG electrode connects the third and the fourth upper electrodes respectively connected to the power voltage electrode and the reference voltage electrode to be connected to the FOG electrode through the fan out interconnection.

The fan out interconnection structure respectively connected to the power voltage electrode and the reference voltage electrode may form a symmetric structure with respect to the FOG electrode.

The fan out interconnection structure may form a symmetric structure with respect to the FOG electrode, wherein the driver IC supplies power to the LED through the FOG electrode.

The plurality of upper electrodes may comprise a third upper electrode connected to a power voltage electrode and a fourth upper electrode connected to a reference voltage electrode, and wherein the FOG electrode connects the third and the fourth upper electrodes respectively connected to the power voltage electrode and the reference voltage electrode to be connected to the FOG electrode through the fan out interconnection structure.

The driver IC may supply power to the LED in a substantially uniform manner through the fan out interconnection structure.

According to another aspect of the disclosure, there is provided a light emitting diode (LED) module comprising: a substrate; a first insulating layer on the substrate; a light emitting diode (LED) on the first insulating layer; a second insulating layer on the first insulating layer and surrounding the LED; a plurality of upper electrodes on the second insulating layer and connected to the LED; an upper insulating layer on the second insulating layer and surrounding the plurality of upper electrodes; a third insulating layer on the upper insulating layer; a film on glass (FOG) electrode on the third insulating layer; and a fan out interconnection structure configured to connect the plurality of upper electrodes to the FOG electrode through the upper insulating layer.

According to another aspect of the disclosure, there is provided a method of forming an light emitting diode (LED) module having a multi-layer structure, the method comprising: providing a substrate; forming a LED on the substrate; forming a plurality of upper electrodes on the LED to be connected to the LED; forming an upper insulating layer to surround the plurality of upper electrodes; providing a film on glass (FOG) electrode on the upper insulating layer; and forming a fan out interconnection structure configured to connect the plurality of upper electrodes to the FOG electrode through the upper insulating layer.

BRIEF DESCRIPTION OF THE DRAWINGS

These and/or other aspects of the disclosure will become apparent and more readily appreciated from the following description of the embodiments, taken in conjunction with the accompanying drawings of which:

FIG. 6B is a view illustrating an operation of the method of manufacturing the display device according to the embodiment in a stepwise manner;

FIG. 7B is a top view of a LED module according to an embodiment.

DETAILED DESCRIPTION

Figure 1A:
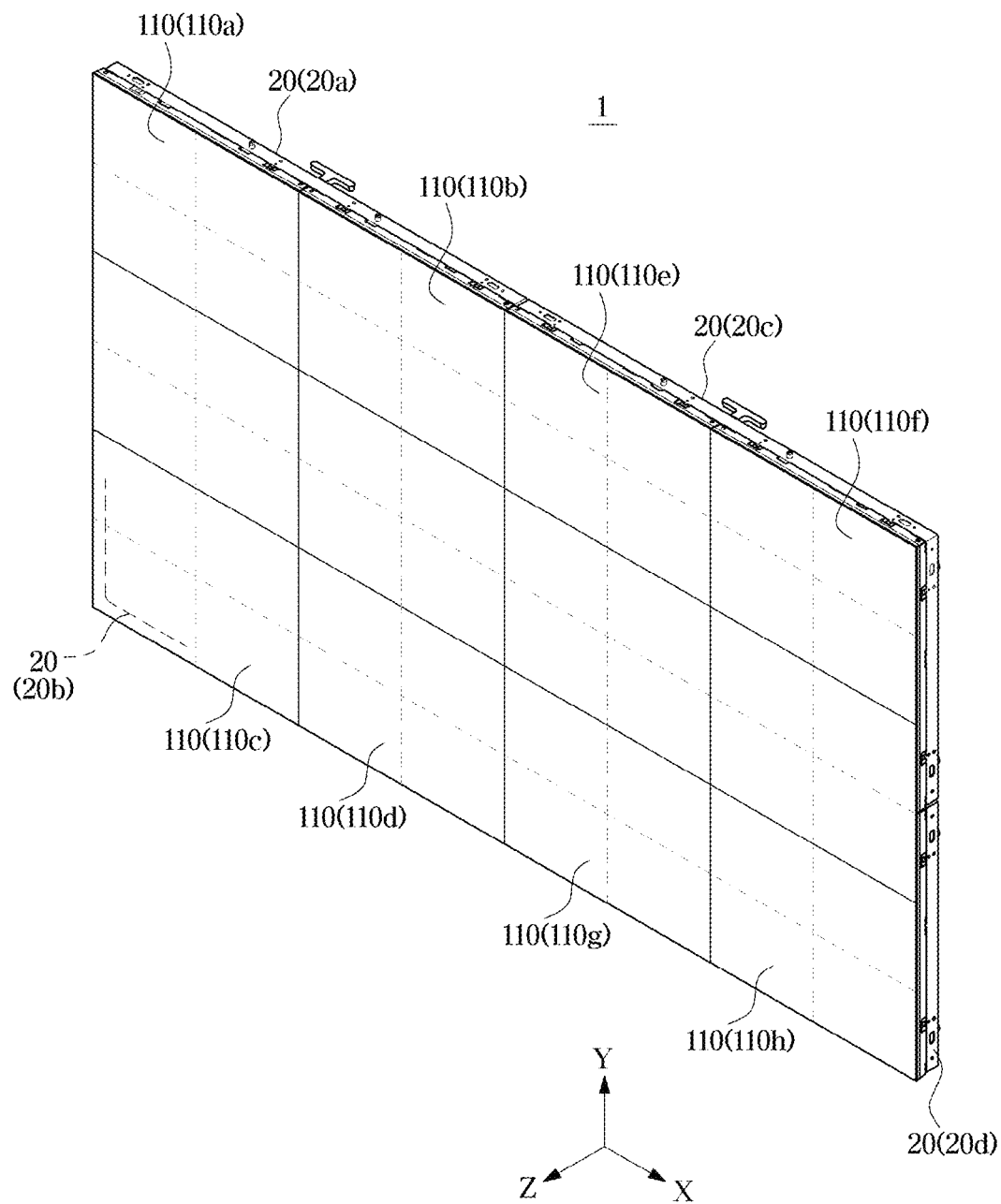
FIG. 1A is a view illustrating an external appearance of a display device according to an embodiment of the disclosure.

The embodiments set forth herein and illustrated in the configuration of the disclosure are only the exemplary embodiments and are not representative of the full the technical spirit of the present disclosure, so it should be understood that they may be replaced with various equivalents and modifications at the time of the disclosure.

As used herein, the singular forms "a," "an," and "the" are intended to include the plural forms as well, unless the context clearly indicates otherwise. In the accompanying drawings, the shape and size of each component shown in the drawings can be exaggerated for clarity of explanation. Throughout the drawings and the detailed description, unless otherwise described, the same drawing reference numerals will be understood to refer to the same elements, features, and structures.

It will be further understood that the terms "comprises," "comprising," "includes," and/or "including," when used herein, specify the presence of stated features, integers, steps, operations, elements, and/or components but do not preclude the presence or addition of one or more other features, integers, steps, operations, elements, components, and/or groups thereof.

It will be understood that, although the terms first, second, etc. may be used herein to describe various elements, the elements should not be limited by the terms. The terms are only used to distinguish one element from another.

Hereinafter, embodiments of the disclosure will be described in detail with reference to the accompanying drawings.

Figure 1B:
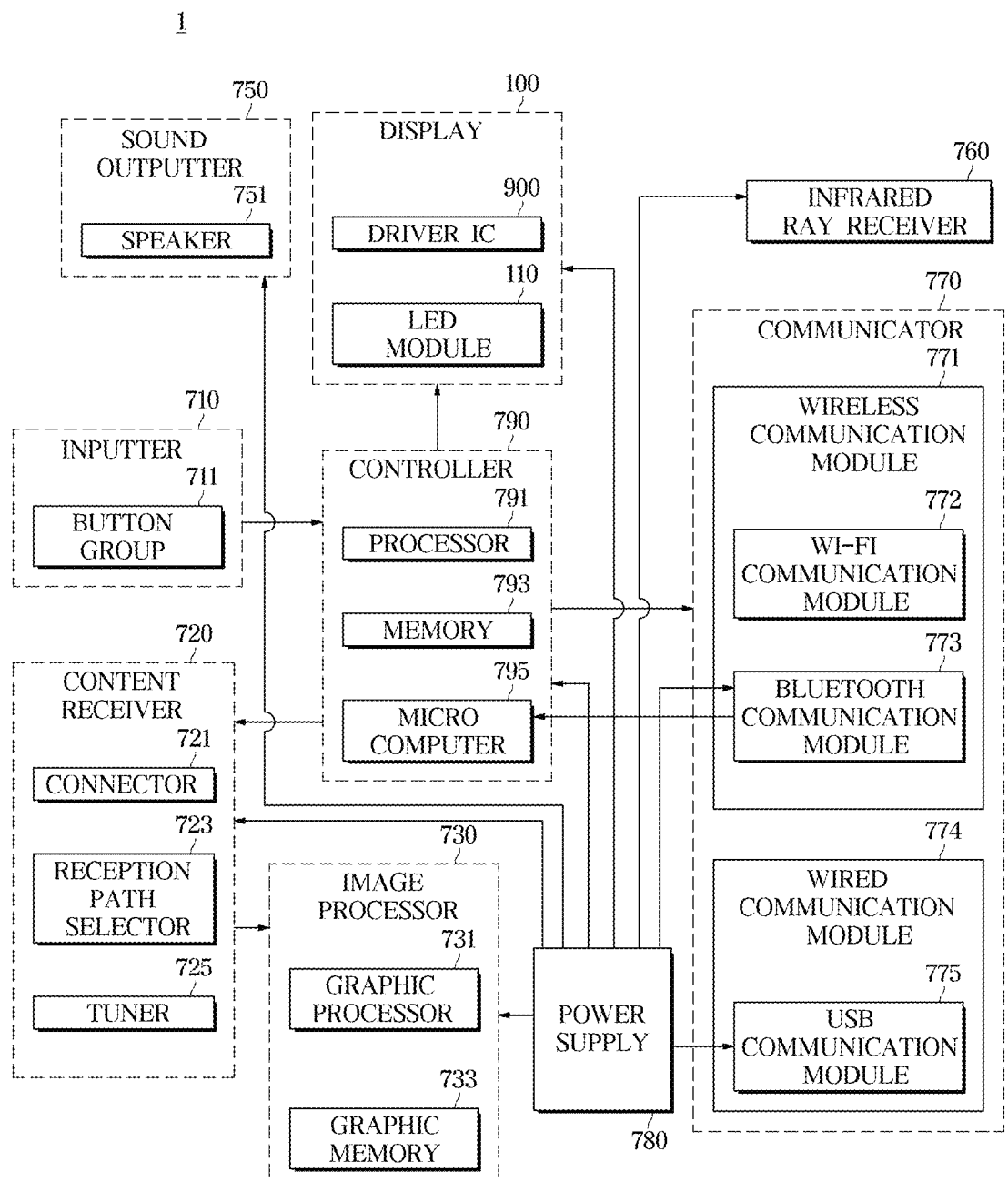
FIG. 1B is a control block diagram of a display device according to an embodiment of the disclosure.

FIG. 1A is a view illustrating an external appearance of a display device 1 according to an embodiment of the disclosure. FIG. 1B is a control block diagram of the display device 1 according to an embodiment of the disclosure.

Figure 2:
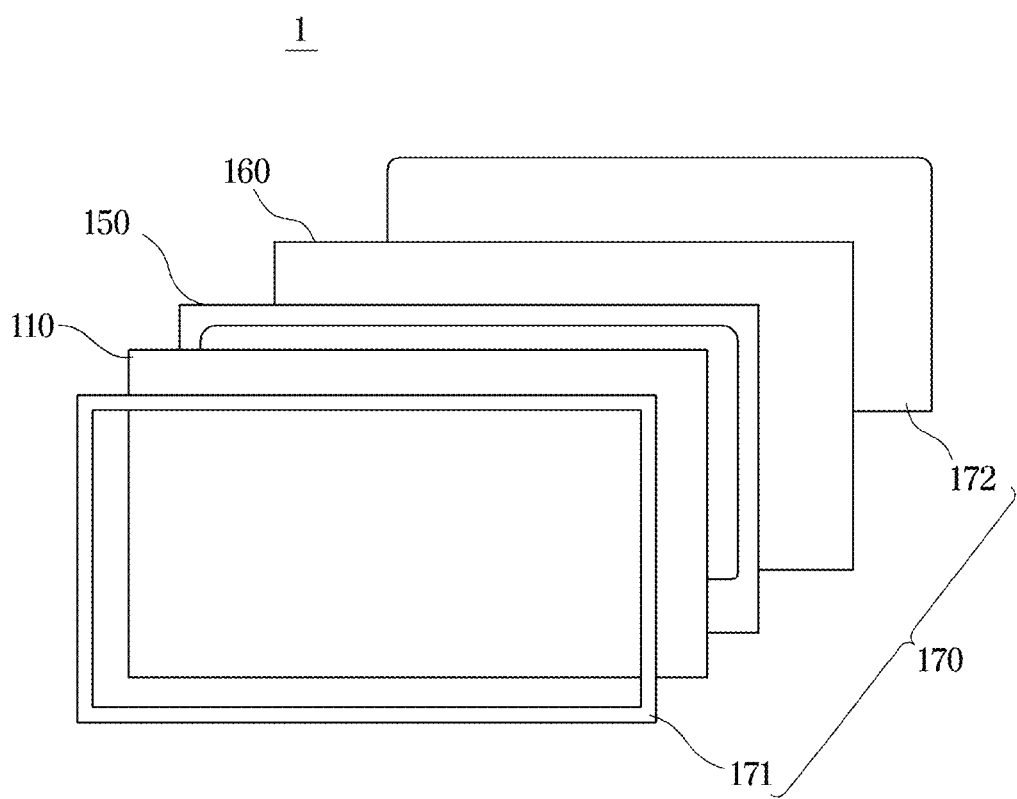
FIG. 2 is an exploded perspective view illustrating the display device according to an embodiment of the disclosure.
Figure 3:
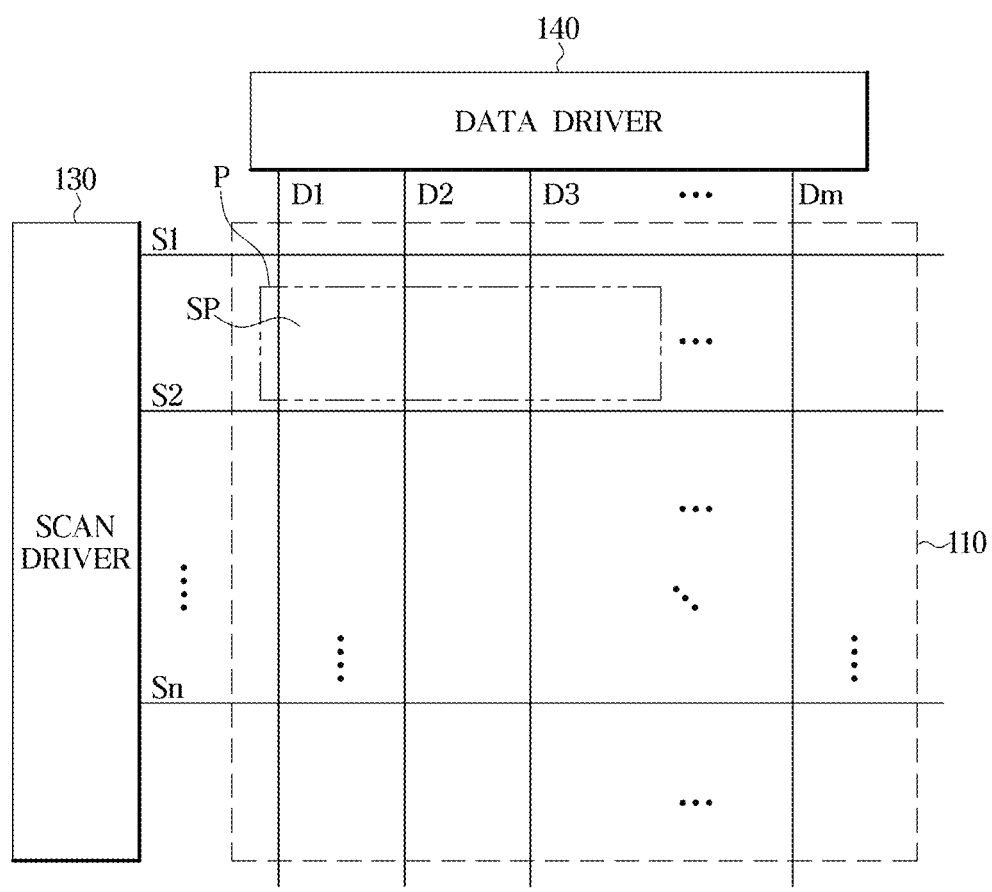
FIG. 3 is a diagram schematically illustrating a configuration of a LED module according to an embodiment of the disclosure.

FIG. 2 is an exploded perspective view illustrating the display device 1 according to the embodiment of the disclosure. FIG. 3 is a diagram schematically illustrating the configuration of a LED module according to the embodiment of the disclosure.

Figure 4:
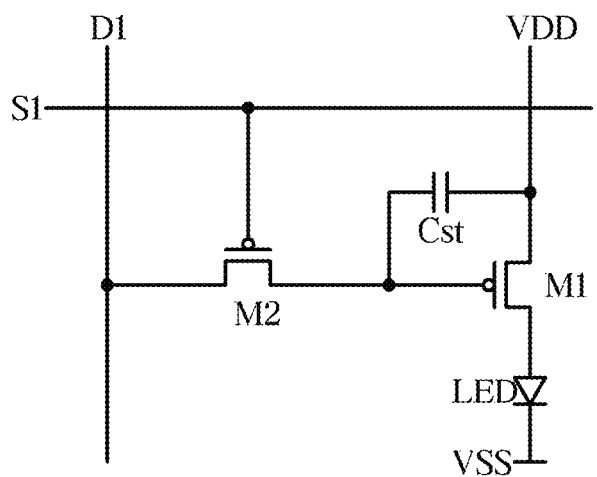
FIG. 4 is a diagram illustrating a circuit diagram of a sub-pixel circuit provided in a sub-pixel area of the LED module shown in FIG. 3.

FIG. 4 is a diagram illustrating a circuit diagram of a sub-pixel circuit provided in a sub-pixel area of the LED module shown in FIG. 3. The display device 1 may display an image from an electrical signal received from the outside.

Specifically, the display device 1 may control the color of each of a plurality of pixels in a predetermined display area so that a user recognizes the display area as an image.

In FIG. 1A, the X-axis, Y-axis, and Z-axis directions that are perpendicular to each other are indicated, in which the X-axis direction refers to the left-right direction, the Y-axis direction refers to the upper-lower direction, and the Z-axis direction refers to the front-rear direction.

The display device 1 is a device that displays information, materials, data, etc., as characters, figures, graphs, images, etc., and may implement a billboard, an electric sign, a screen, a television, a monitor, etc. The display device may be installed on a wall or ceiling, or may be installed on an indoor or outdoor ground by a stand.

The display device 1 may include a light emitting diode (LED) module 110 displaying a screen and a frame 20 coupled to the rear of the LED module 110 to support the LED module 110. According to an embodiment, the display device 1 may include a plurality of LED modules 110(*a*)-110(*f*) combined to form a display panel, and a plurality of frames 20(*a*)-20(*d*) coupled to the rear of the LED modules 110(*a*)-110(*f*) to support the LED modules 110(*a*)-110(*f*).

Referring to FIG. 1B, a control block diagram of the display device 1 according to the embodiment is illustrated.

The display device 1, which is an example of an electronic device, is a device capable of processing an image signal received from the outside and visually displaying the processed image. For example, the display device 1 may be implemented in various forms, such as a monitor and a portable multimedia device, and the form is not limited as long as it can visually displays an image.

As shown in FIG. 1B, the display device 1 includes an inputter 710 receiving a control command from a user, a content receiver 720 receiving a content including images and sounds from an external device, an image processor 730 processing image data included in the content, a display 100 displaying an image corresponding to the image data included in the content, an audio outputter 750 outputting sound corresponding to sound data included in the content, and a main controller 790 controlling the overall operation of the display device 1.

According to an embodiment, the inputter 710 may be an input circuit or an input interface configured to receive the control command from the user. Also, according to an embodiment, the audio outputter 750 may be an output circuit or an output interface configured to output sound.

Here, the inputter 710 may include a button group 711 receiving various control commands from a user.

For example, the button group 711 includes a volume button for adjusting the volume of sound output from the sound outputter 750, a channel button for changing a communication channel received by the content receiver 720, and a power button for turning on/off the power of the display device 1, and the like. In addition, the inputter 710 may receive various control commands related to the operation of the display device 1 and an Internet of Things (IoT) device through the button group 711 described above from a user, and there is no limit to the inputter 710.

On the other hand, various buttons included in the button group 711 employ a push switch and a membrane switch that sense the user's pressure, or a touch switch that senses a contact of a user's body part. However, the disclosure is not limited thereto, and the button group 711 may employ various input devices capable of outputting an electrical signal in response to a specific operation of a user.

In addition, the inputter 710 may include a remote controller that receives a control command from a user at a remote site and transmits the received user control command to the display device 1. In addition, the inputter 710 may include generally known various components capable of receiving a control command from the user. In addition, when the LED module 110 is implemented as a touch screen type, the LED module 110 may serve as the inputter 710.

For example, the inputter 710 may receive a control command related to an IoT device from a user through the button group 711, the remote controller, or the display implemented as a touch screen type described above. Accordingly, the inputter 710 may transmit a control command related to the IoT device to the controller 790 through a control signal.

The content receiver 720 may receive various types of content from various external devices. For example, the content receiver 720 may receive contents from an antenna that receives a broadcast signal in a wireless manner, a set top box that receives a broadcast in a wireless or wired manner and converts the signal appropriately, and a multimedia playback device that reproduces content stored on a multimedia storage medium, for example, a DVD player, CD player, Blu-ray player, etc.

Specifically, the content receiver 720 may include a connector 721 or a plurality of connectors connected to external devices, a receiving path selector 723 selecting a path which to receive content from among the plurality of connectors, and a tuner 735 selecting a channel (or frequency) which to receive a broadcast signal for reception of broadcast signals.

The connector 721 may include a coaxial cable connector for receiving a broadcast signal including content from an antenna, a high definition multimedia interface (HDMI) connector for receiving content from a set-top box or a multimedia player, a component video connector, a composite video connector, a D-sub connector, and the like.

The reception path selector 723 selects a connector 721 that is to be used to receive content from among the plurality of connectors described above. For example, the reception path selector 723 may automatically select the connector 721 with which content has been received, or manually select the connector 721 with which content is to be received according to the user's control command.

When receiving a broadcast signal, a tuner 725 extracts a transmission signal of a specific frequency (channel) from among various signals received through the antenna or the like. In other words, the tuner 725 may select a channel (or frequency) for receiving content according to a user's channel selection command.

Meanwhile, referring to FIG. 1B, the display device 1 may be provided with the image processor 730. The image processor 730 may process image content included in the contents received by the content receiver 720, and provide the display 100 with the processed image data.

In this case, the image processor 730 may include a graphic processor 731 and a graphic memory 733 as shown in FIG. 1B. The graphic processor 731 and the graphic memory 733 are implemented as separate single chips. However, the graphic processor 731 and the graphic memory 733 are not limited to being implemented as single chips, and the graphic processor 731 and the graphic memory 733 may be integrated and implemented on a single chip.

The graphic processor 731 may process the image data stored in the graphic memory 733 according to an image processing program stored in the graphic memory 733. In addition, the graphic memory 733 may store image processing program and image processing information for image processing, or may temporarily store image information output from the graphic processor 731 or image information received from the content receiver 720.

Meanwhile, referring to FIG. 1B, the display device 100 may be provided with the display 1. The display 100 may include the LED module 110 that visually displays an image and a driver integrated chip (IC) 900 that drives the LED module 110.

The LED module 110 may include a pixel serving as a unit for displaying an image. Each pixel may receive an electrical signal representing image data and output an optical signal corresponding to the received electrical signal. As such, optical signals output from a plurality of pixels included in the LED module 110 are combined so that one image is displayed on the LED module 110.

In addition, the LED module 110 may be classified into several types according to a method in which each pixel outputs an optical signal. For example, the LED module 110 may be classified into a emissive display in which pixels emits light by themselves, a transmissive display that blocks or transmits light emitted from a backlight, and the like, and a reflective display that reflects or absorbs light incident from an external light source.

Here, the LED module 110 may be provided using a cathode ray tube (CRT) display panel, a liquid crystal display (LCD) panel, a LED panel, an organic OLED, a plasma display panel (PDP), a field emission display (FED) panel, etc., and there is no limitation on the LED module 110.

However, the LED module 110 is not limited thereto and may employ various display devices as long as it can visually display an image corresponding to the image data. Meanwhile, the display panel 20 may be abbreviated and referred to as a display.

The driver IC 900 may receive image data from the image processor 730 according to a control signal from the controller 790 and drive the LED module 110 to display an image corresponding to the received data. According to the embodiment, the driver IC may drive the LED module 110 in connection with a Film on Glass (FOG) electrode which will described below.

In addition, the display device 1 may be provided with the sound outputter 750.

The sound outputter 750 may receive sound information from the content receiver 720 according to a control signal from the main controller 790 and output sound. In this case, the sound outputter 750 may include one or two or more speakers 751 for converting an electrical signal into a sound signal.

In addition, the display device 1 may be provided with an infrared ray receiver 760.

The infrared ray receiver 760may receive an infrared signal. For example, an infrared ray emitter may be provided in the remote controller. When the remote controller receives a control command from a user, the remote controller converts the control command into an infrared signal and transmits the infrared signal through the infrared ray emitter. Accordingly, the infrared ray receiver 760 may receive the infrared signal and recognize the control command from the received infrared signal. Here, the infrared ray receiver 760 may be implemented through various methods known to those skilled in the art without limitation.

Meanwhile, the display 1 may be provided with a communicator 770 as shown in FIG. 1B. The communicator 770 may include a wireless communication module 771 supporting a wireless communication method, and a wired communication module 774 supporting a wired communication method to support various communication methods.

The communicator 770 may communicate with a relay server and other electronic devices. Data transmitted and received between the communicator 770 and the relay server and other electronic devices may include data for controlling each general device and an encryption key of each electronic device.

The communication method includes a wireless communication method and a wired communication method. Here, the wireless communication method refers to a communication method capable of wirelessly sending and receiving signals containing data. The wireless communication method may include 3Generation (3G), 4Generation (4G), Wireless LAN, Wi-Fi, Bluetooth, Zigbee, Wi-Fi Direct (WFD), Ultra wideband (UWB), Infrared Data Association (IrDA), Bluetooth Low Energy (BLE), Near Field Communication (NFC), Z-Wave, and other various communication methods without limitation.

In addition, the wired communication method refers to a communication method that can send and receive signals containing data in a wired manner. For example, the wired communication method includes Peripheral Component Interconnect (PCI), PCI-express, Universe Serial Bus (USB), etc. However, there is no limitation on the wired communication method.

For example, the communicator 770 may transmit and receive wireless signals to and from IoT devices through a base station by a communication method, such as 3G, 4G, etc. In addition, the communicator 770 may transmit and receive wireless signals including data to and from a device within a predetermined distance through wireless LAN, Wi-Fi, Bluetooth, Z-wave, Zigbee, WFD, UWB, IrDA, BLE, NFC, etc.

Referring to FIG. 1B, the wireless communication module 771 includes a Wi-Fi communication module 772 supporting a Wi-Fi communication method, and a Bluetooth communication module 773 supporting a Bluetooth communication method. In addition, the wired communication module 774 includes a USB communication module 775 supporting a USB communication method.

In addition, the communicator 770 may include at least one communication module supporting the above-described communication method, and is not limited to the drawings. In this case, each communication module may be implemented as separate single chips according to the communication methods. Alternatively, a plurality of communication modules may be integrated and implemented as a single chip.

In addition, the display device 1 may be provided with a power supply 780 as shown in FIG. 1B.

The power supply 780 supplies power to each component of the display device 1 so that the display device 1 is driven. The power supply 780 may supply the power required for driving each component to activate the display device 1.

Meanwhile, the power supply 780 may supply standby power to some of the components of the display device 1. Here, the standby power refers to power consumed by the device even when the power is turned off. In other words, standby power refers to the electrical energy supplied into the device by simply plugging the device into an outlet regardless of the operation of the device.

On the other hand, standby power differs between countries and differs between devices. For example, the standby power of the display device 1 may be 0.5 W, the standby power of a dishwasher may be 0.5 W, and the standby power of an electric rice cooker may be 2 W. Standards for standby power may be differently set according to devices and countries.

Even when the main power of the display device 1 is turned off, the power supply 780 supplies the standby power to some of the components of the display device 1 to constantly activate the components.

For example, the power supply 780 may activate the infrared ray receiver 760 through standby power. Accordingly, even when the display device 1 is in an off state, that is, in an inactive state, the infrared ray receiver 760 may receive an infrared signal transmitted from the remote controller, and turn on the power of the display device 1.

Meanwhile, the display device 1 may be provided with the controller 790.

The controller 790 may supply power to the LED module through the driver IC.

The controller 790 includes a processor 791, a memory 793, and a microcomputer 795 as shown in FIG. 1B. Here, at least one of the processor 791, the memory 793, and the microcomputer 795 may be integrated into a System On Chip (SOC) embedded in the display device 1. However, since one or more SOCs may be embedded in the display device 1, the at least one of the processor 791, the memory 793, and the microcomputer 795 is not limited to as being integrated in one SOC.

The memory 793 may store a control program and control data for controlling the operation of the display device 1, and temporarily store a control command received through the inputter 710 or a control signal output from the processor 791.

Meanwhile, a method of implementing a user interface may be implemented as an algorithm or program and stored in the memory 793. Accordingly, the processor 791 may generate a user interface using the data stored in the memory 793.

The processor 791 may control the overall operation of the display device 1. For example, the processor 791 generates a control signal for controlling the components of the display device 1 to control the operation of each component.

The processor 711 may transmit a control signal to the sound outputter 750 according to a sound adjustment command input through the inputter 710 such that the volume of the sound output through the speaker 751 is adjusted. In another embodiment, the processor 791 may control the image processor 730 to image-process the image information received from the content receiver 720, and control the display 100 to display the image-processed image data.

In one embodiment, the processor 791 includes a graphic processor such that the above-described graphic user interface is implemented to be displayed on the LED module 110.

The power supply 780 activates the infrared ray receiver 760 and the Bluetooth communication module 773 using standby power, so that the power supply 780 may operate even when the main power is not supplied to the display device 1. Accordingly, when a power-on signal is input from at least one of the infrared ray receiver 760 and the Bluetooth communication module 773, the microcomputer 795 allows the main power to be supplied to the display device 1.

In one embodiment, when the power of the display device 1 is turned off, the user may click a power button attached to the remote controller. Then, the remote controller may request a power-on of the display device 1 through an infrared signal. Accordingly, the infrared ray receiver 760 may receive the infrared signal and may input a power-on signal to an interrupt port of the microcomputer 795. The microcomputer 795 activates the processor 791 to activate the display device 1, thereby causing the display device 1 to be powered on.

Referring to FIG. 2, the display device 1 may include a LED module 110, a support member 150, a chassis 160, and a housing 170.

The housing 170 may form the external appearance of the display device 1 and may include a bezel 171 and a cover 172. The bezel 171 and the cover 172 may be coupled to each other to form an accommodation space. The LED module 110, the support member 150, a chassis 160, and the like may be disposed in the accommodation space.

The support member 150 may support the LED module 110 and the chassis 160 disposed between the bezel 171 and the cover 172. To this end, the support member 150 may be detachably coupled to the bezel 171 to fix the LED module 110 and the chassis 160.

The chassis 160 may connect various components required for image display and sound output. That is, various printed circuit boards, input/output devices, and the like may be provided on the chassis 160. The chassis 160 may be formed of a metal material having excellent heat dissipation and strength.

The LED module 110 enables a user to visually recognize an image. The LED module 110 may refer to a panel that emits light having a frequency corresponding to an image signal received from outside or generated inside the display device 1.

Referring to FIG. 3, on one surface of the LED module 110, a plurality of data lines D1-Dm arranged in a column direction, a plurality of scan lines S1-Sn arranged in a row direction, and a plurality of sub-pixel areas SP formed adjacent to intersections of the scan lines S1-Sn and the data lines D1-Dm. A sub-pixel circuit may be provided in each sub-pixel area SP. At least three sub-pixel areas SP adjacent to each other among the plurality of sub-pixel areas SP may constitute a pixel area P.

The data lines D1-Dm transfer data signals representing image signals to the sub-pixel circuits in the sub-pixel areas SP, and the scan lines S1-Sn transfer scan signals to the sub-pixel circuits in the sub-pixel areas SP.

Scan signals are sequentially applied to the scan lines S1-Sn, respectively, by a scan driver 130, and data voltages VDATA corresponding to the image signals are supplied to the data lines D1-Dm, respectively, by a data driver 140.

According to the embodiment of the disclosure, the scan driver 130 and the data driver 140 may be mounted on a substrate 111 of the LED module. Accordingly, the bezel (a width area in the lateral direction covering the pixel area) of the LED module 110 may be minimized or omitted so that the entire area of the front surface of the LED module 110 may form pixel areas.

FIG. 4 is an equivalent circuit diagram showing a sub-pixel circuit in the sub-pixel area SP of FIG. 3. Specifically, FIG. 4 illustrates a sub-pixel circuit driven by the first scan line S1 and the first data line D1.

Referring to FIG. 4, the sub-pixel circuit may include a LED, two transistors M1 and M2, and a capacitor Cst. The plurality of transistors M1 and M2 may be implemented as PMOS transistors. However, the circuit configuration is only an example of the sub-pixel circuit, and the disclosure is not limited to the circuit configuration of FIG. 4.

According to an embodiment, the transistor M2 may be a switching transistor, and may have a gate electrode connected to the scan line Sn, a source electrode connected to the data line Dm, and a drain electrode connected to one end of the capacitor Cst and connected to a gate electrode of the transistor M1, which may be a driving transistor. The capacitor Cst may have the other end connected to a power voltage VDD. In addition, the driving transistor M1 may have a source electrode connected to the power voltage VDD and a drain electrode connected to an anode 310 of the LED. The LED may have a cathode 320 connected to a reference voltage VSS to emit light based on the current applied from the driving transistor Ml.

The reference voltage VSS connected to the cathode 320 of the LED is a voltage lower than the power voltage VDD, and may be provided using a ground voltage or the like.

According to an embodiment, the sub-pixel circuit operates as follows. First, when a scan signal is applied to the scan line Sn to turn on the switching transistor M2, so that a data voltage is transferred to the one end of the capacitor Cst and the gate electrode of the driving transistor M1. As a result, a gate-source voltage VGS of the driving transistor M1 may be maintained for a certain period by the capacitor Cst. In addition, the driving transistor M1 applies a current ILED corresponding to the gate-source voltage VGS to the anode 310 of the LED, causing the LED to emit light.

In this case, when a high data voltage VDATA is transmitted to the gate electrode of the driving transistor M1, the gate-source voltage VGS of the driving transistor M1 is lowered, so that a small amount of current ILED is applied to the anode 310 of the LED, and the LED emits less light, thereby displaying a low gray scale. On the other hand, when a low data voltage (VDATA) is transmitted to the gate electrode of the driving transistor Ml, the gate-source voltage (VGS) of the driving transistor M1 increases, so that a large amount of current (ILED) is applied to the anode 310 of the LED, and the LED emits a lot of light, displaying a high gray scale. As such, the level of the data voltage VDATA applied to each of the sub-pixel circuits may be determined based on an image to be displayed.

Figure 5:
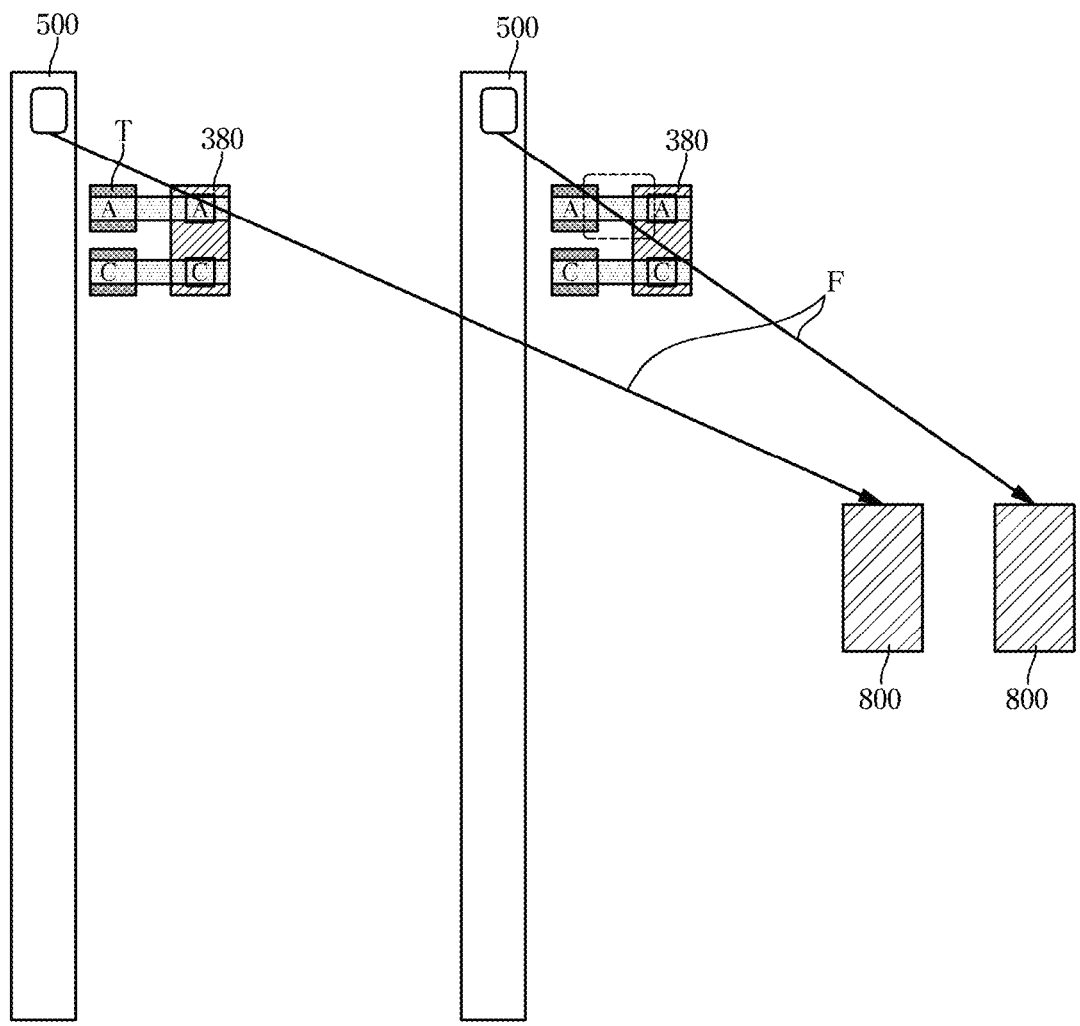
FIG. 5 is a diagram for describing a configuration in which an upper electrode 500 is provided independent of an interconnection structure connected to an LED according to an embodiment.

FIG. 5 is a diagram for describing a configuration in which an upper electrode is provided independent of an interconnection structure T connected to a LED according to an exemplary embodiment.

Referring to FIG. 5, a LED module 110 according to an embodiment includes a LED 380, an interconnection structure T connecting the LED 380, an upper electrode 500, a fan-out interconnection F, and a FOG electrode 800.

The interconnection structure T may refer to an interconnection of the LED module 110 required to drive the LED 380.

As will be described below, the upper electrode 500 may refer to an electrode including an electrode provided in a specific layer in the LED module 110 to supply signals and power.

The fan-out interconnection F may refer to an interconnection structure connected to the upper electrode 500 so as to connect the upper electrode 500 to the FOG electrode 800.

The use of the fan-out interconnection F may allow the number of driver ICs and FOG electrodes to be reduced in driving the LED module 110.

On the other hand, since a plurality of the upper electrodes and interconnections used to connect the substrate and the LEDs need to exist in each pixel of the LED, and in order to implement the fan-out interconnection structure, an upper insulating layer structure may be provided as described below. Detailed descriptions thereof will be provided in the relevant parts.

In addition, the fan-out interconnection F, the FOG electrode 800, and the interconnection structure T connecting the LED 380 may be formed on separate layer structures to avoid crossing each other on the same layer.

Therefore, as will be described below, when the upper electrodes are connected to the FOG electrode through the upper insulating layer and the fan-out interconnection formed in the upper insulating layer, the FOG electrode may have a high degree of freedom to the position.

Hereinafter, a structure of the LED module in which the above-described upper electrode and interconnection structures are connected to the FOG electrode through the upper insulating layer will be described in detail.

FIGS. 6A to 6E are views sequentially illustrating operations of a method of manufacturing a display device according to an embodiment.

Figure 6A:
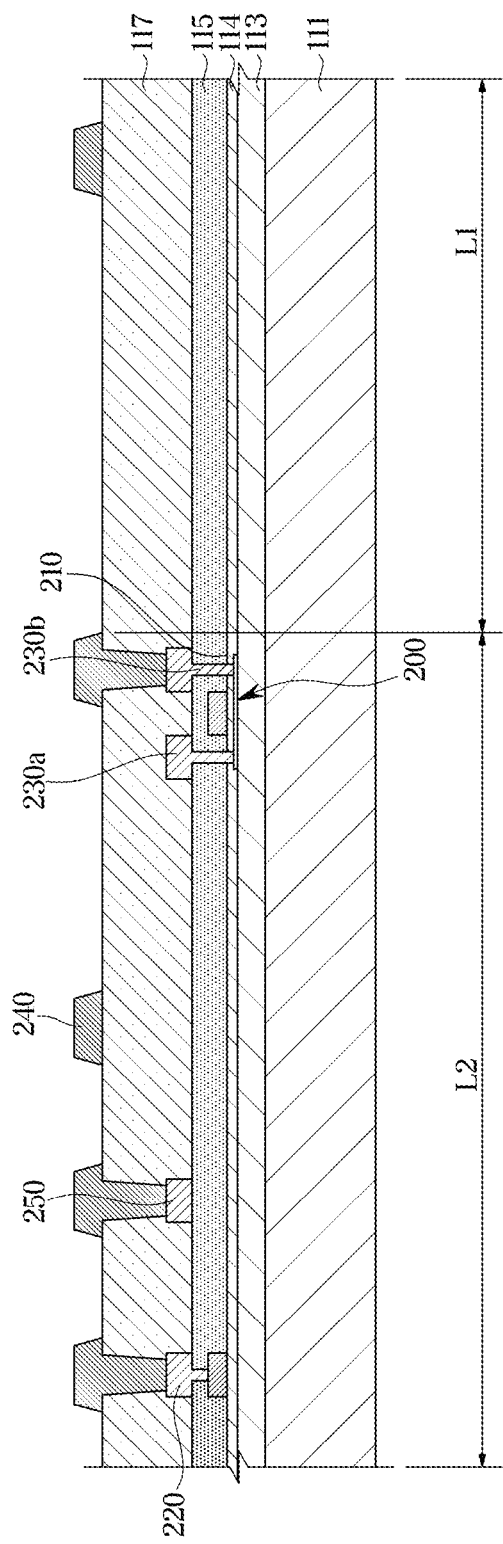
FIG. 6A is a view illustrating an operation of a method of manufacturing a display device according to an embodiment in a stepwise manner.

Referring to FIG. 6A, a substrate 111 is prepared. According to an embodiment, a light absorbing layer may be formed on the substrate 111.

The substrate 111 may be formed of various materials. For example, the substrate 111 may be formed of a transparent glass material containing SiO2 as a main component. However, the substrate 111 is not limited thereto, and may be formed of a transparent plastic material to have flexibility. Plastic materials may be insulating organic materials selected from the group consisting of polyethersulphone (PES), polyacrylate (PAR), polyetherimide (PEI), polyethylene naphthalate (PEN), polyethylene terephthalide (PET), polyphenylene sulfide (PPS), polyallylate, polyimide, polycarbonate (PC), and cellulose triacetate (TAC), cellulose acetate propionate: CAP).

According to the embodiment of the disclosure, the LED module 110 is a bottom emissive type LED module, and the substrate 111 may be formed of a transparent material.

The substrate 111 may include a light emitting region L1 in which the LED 380 is disposed and light is emitted and a non-emitting region L2 in which circuit elements, such as the thin film transistor (TFT) 200, are disposed and no light is emitted. A light absorbing layer for improving visibility by absorbing external light may be formed on the non-emitting region L2 of the substrate 111.

Meanwhile, the LED described above may be provided as an inorganic LED.

According to an embodiment, the LED 380 may have a size of 10-100 μm, and is formed by growing a plurality of thin films of inorganic material, such as Al, Ga, N, P, As In, on a sapphire substrate or a silicon substrate, and cutting and separating the sapphire substrate or silicon substrate.

The light absorbing layer may include a black inorganic material, a black organic material, or a black metal that effectively absorbs light.

For example, the light-absorbing material may be formed of carbon black, polyene pigment, azo based pigment, azomethine based pigment, diimmonium based pigment, phthalocyanine based pigments, quinone based pigments, indigo based pigments, thioindigo based pigments, dioxadin based pigments, quinacridone based pigments, isoindolinone based pigments, metal oxides, metal complexes, and other materials such as aromatic hydrocarbos.

As illustrated in FIG. 6A, a buffer layer 113 may be formed on the substrate 111. The buffer layer 113 may provide a flat surface on the substrate 111 and may block foreign substance or moisture from being introduced into the substrate 111. For example, the buffer layer 113 may include inorganic materials, such as silicon oxide, silicon nitride, silicon oxynitride, aluminum oxide, aluminum nitride, titanium oxide, or titanium nitride, or organic materials, such as polyimide, polyester, and acrylic, or may be formed of a plurality of laminates of the above described materials.

Referring to FIG. 6B, the TFT 200 and the LED 380 may be provided on the buffer layer 113.

The transistor 200 may include a semiconductor active layer 210, a gate electrode 220, a source electrode 230a, and a drain electrode 230b. The semiconductor active layer 210 may include a semiconductor material, and may have a source region, a drain region, and a channel region between the source region and the drain region. The gate electrode 220 may be formed on the active layer 210 to correspond to the channel region. The source electrode 230a and the drain electrode 230b may be electrically connected to the source region and the drain region of the active layer 210, respectively.

A gate insulating layer 114 may be disposed between the active layer 210 and the gate electrode 220. The gate insulating layer 114 may be formed of an inorganic insulating material. According to an embodiment, the gate insulating layer 114 may be formed on the buffer layer 113.

An interlayer insulating layer 115 may be disposed between the gate electrode 220 and the source electrode 230a and between the gate electrode 220 and the drain electrode 230b. The interlayer insulating layer 115 may be formed of an organic insulating material or an inorganic insulating material, and may be formed by alternately forming an organic insulating material and an inorganic insulating material. According to an embodiment, the interlayer insulating layer 115 may be formed on the gate insulating layer 114.

A first insulating layer 117 is disposed on the source electrode 230a and the drain electrode 230b as a planarization layer. The first insulating layer 117 may be formed of an organic insulating material or an inorganic insulating material, and may be formed by alternately forming an organic insulating material and an inorganic insulating material. According to an embodiment, the first insulating layer 117 may be formed on the interlayer insulating layer 115.

According to the embodiment of the disclosure, the TFT 200 is provided as a top gate type TFT in which the gate electrode 220 is disposed on the semiconductor active layer 210 as an example, but the disclosure is not limited thereto. For example, the gate electrode 220 may be disposed under the semiconductor active layer 210.

As shown in FIG. 6B, the LED 380 may be disposed on the first insulating layer 117. According to the embodiment of the disclosure, the LED 380 may be a micro LED. Here, the micro may denote a size of 1 to 100 μm, but the disclosure is not limited thereto, and may be applied to a LED having a size larger or smaller than the range of 1 to 100 μm.

The micro LEDs may be individually or collectively picked up on a wafer by a transfer device and transferred to the substrate 111. Such a micro LED, formed of an inorganic material, may have a reaction speed faster than that of an organic OLED using an organic material, and may support low power consumption and high brightness. In addition, organic LEDs, which are vulnerable to moisture and oxygen require a sealing process and have poor durability, but micro LEDs may have excellent durability with a sealing process.

The LED 380 may emit light having a predetermined wavelength belonging to a wavelength range from ultraviolet light to visible light. For example, the LED 380 may be a red, green, blue, white LED or ultraviolet (UV) LED. That is, a red LED, a green LED, and a blue LED are respectively disposed in adjacent sub-pixel area SP, and form one pixel area P. One color may be determined by mixing red light, green light, and blue light generated in one pixel area P.

The LED 380 may include a p-n diode, an anode 310, and a cathode 320. The anode 310 and/or cathode 320 may be formed of a variety of conductive materials including metals, conductive oxides, and conductive polymers. The anode 310 may be electrically connected to the signal electrode 510, and the cathode 320 may be electrically connected to a common ground electrode 530. The p-n diode may include a p-doped portion on a side of the anode 310, at least one quantum well portion, and an n-doped portion on a side of the cathode 320. Alternatively, the doped portion on the side of the cathode 320 may be a p-doped portion, and the doped portion on the side of the anode 310 may be an n-doped portion.

The anode 310 and the cathode 320 may be located on the upper surface of the LED 380. Conversely, a light emitting surface of the LED 380 may be located on the bottom of the LED 380. Accordingly, the light emitting surface of the LED 380 comes in contact with the first insulating layer 117, and the LED 380 may emit light toward the substrate 111.

The gate electrode 220 and a data electrode 250 may be provided in the first insulating layer 117. Meanwhile, the interconnection structure connecting the gate electrode 220 and the data electrode 250 to the LED 380 may be provided on the first insulating layer 117 and a second insulating layer 118.

That is, according to the embodiment of the disclosure, the LED 380 may be a bottom emissive type LED. Since the LED 380 is a bottom emissive type LED, a pixel circuit element, such as the TFT 200, and the LED 380 are disposed so as not to overlap each other in the vertical direction. The LED 380 may be fixed on the first insulating layer 117 by an adhesive coating.

As shown in FIG. 6B, the second insulating layer 118 may be provided on the first insulating layer 117 to surround the LED 380. The second insulating layer 118 may include an organic insulating material. For example, the second insulating layer 118 may be formed of acrylic, polymethyl methacrylate (PMMA), benzocyclobutene (BCB), polyimide, acrylate, epoxy, polyester, etc., but is not limited thereto.

The upper electrodes 220s, 250s, 240s, and Vss may connect various driver ICs 900 for driving the LED module 110 to the pixel circuit.

For example, the upper electrodes 220s, 250s, 240s, and Vss may be connected to a power voltage electrode 240, the data signal electrode 250, the gate electrode 220, and the reference voltage VSS.

The upper electrodes 220s, 250s, 240s, and Vss may include the signal electrode 510 connecting the drain electrode 230b of the TFT 200 to the anode 310 of the LED 380 so as to apply a data signal to the LED 380 and the common ground electrode 530 connecting the cathode 320 of the LED 380 to the reference voltage VSS 554 so as to ground the LED 380.

Since the LED 380 is a bottom emissive type LED, the first insulating layer 117, the interlayer insulating layer 115, the gate insulating layer 114, and the buffer layer 113 described above may all be formed of transparent material.

Figure 6C:
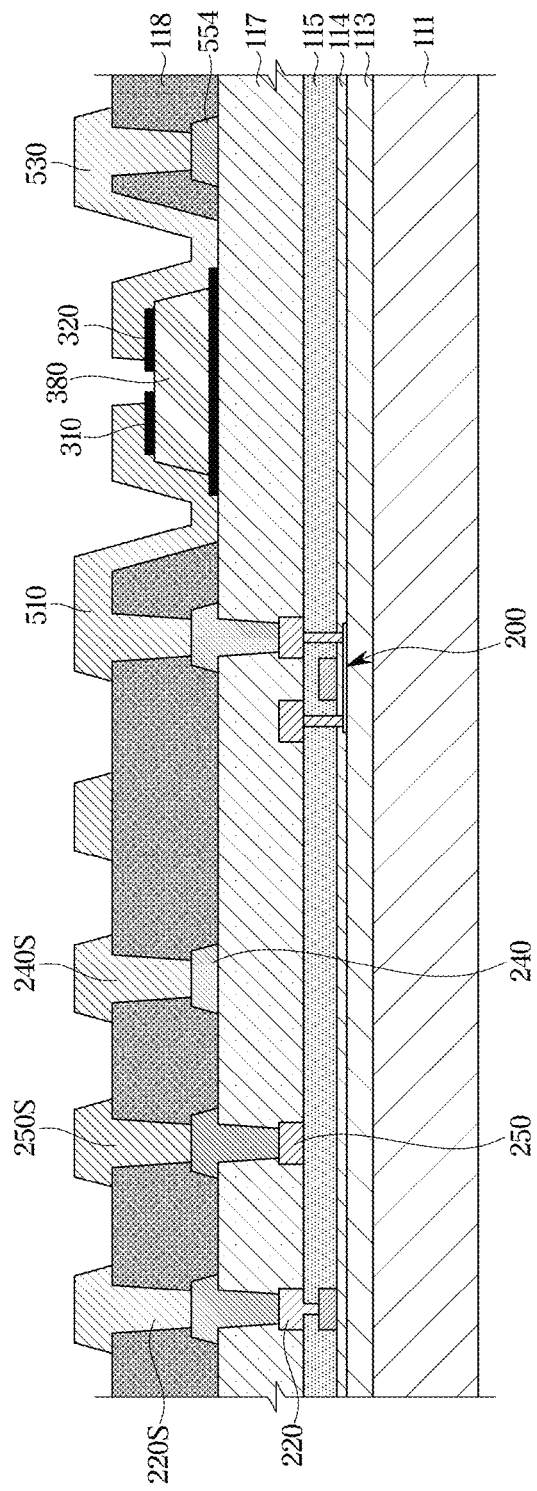
FIG. 6C is a view illustrating an operation of the method of manufacturing the display device according to the embodiment in a stepwise manner.

Meanwhile, FIG. 6B shows that the LED is transferred and then the second insulating layer is formed, but FIG. 6C shows that the second insulating layer is formed and then the LED is transferred. In forming the second insulator and the LED on the substrate, the order may be changed, and the interconnection shape may be changed according to the order.

Figure 6D:
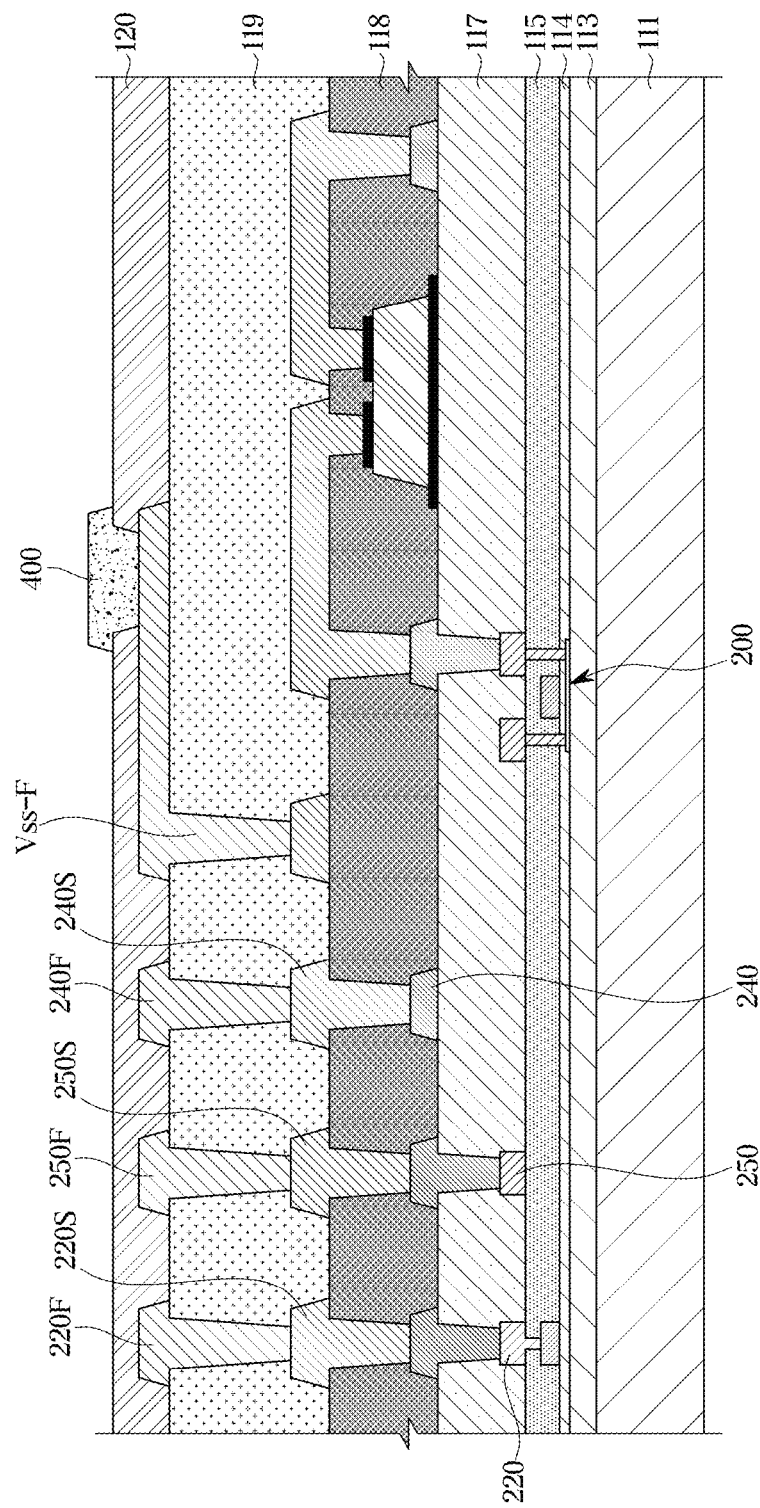
FIG. 6D is a view illustrating an operation of the method of manufacturing the display device according to the embodiment in a stepwise manner.

Referring to FIG. 6D, the above-described upper electrode may be provided on the upper insulating layer 119, and the upper insulating layer 119 may further include fan-out interconnections 220-F, 250-F, 240-F, and Vss-F connected to the upper electrodes.

Meanwhile, the upper insulating layer 119 is provided to allow the interconnection structure connected to the LED to be formed in a layer different from a layer forming the fan interconnections 220-F, 250-F, 240-F, and Vss-F while protecting the LED.

In addition, via holes H corresponding to the upper electrodes may be formed in the upper insulating layer 119 to form the fan-out interconnections.

Figure 6E:
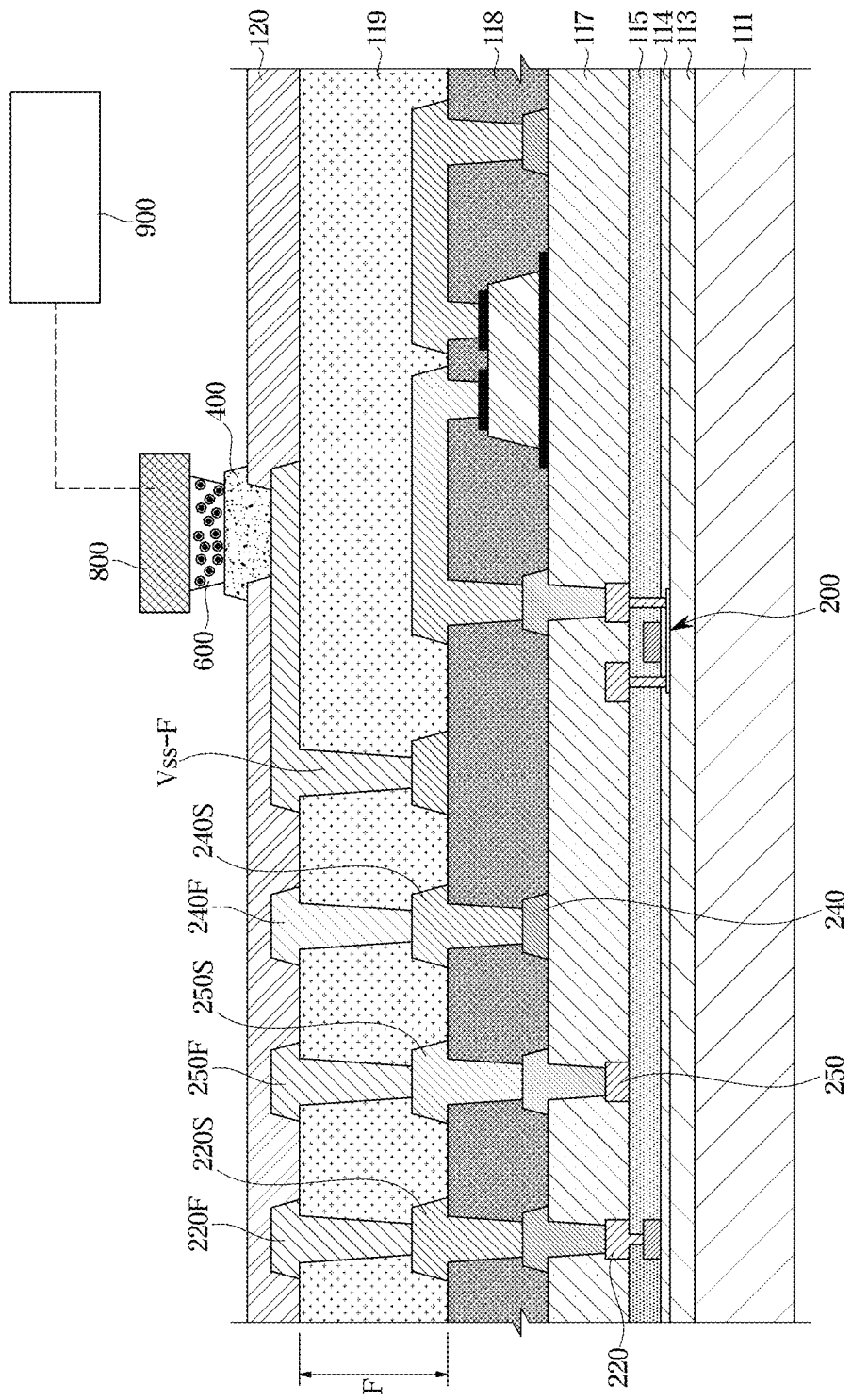
FIG. 6E is a view illustrating an operation of the method of manufacturing the display device according to the embodiment in a stepwise manner.

Referring to FIG. 6E, a third insulating layer 120 is provided on the upper insulating layer 119 such that the fan-out interconnection is connected to the FOG electrode 800 through a capping metal 400. Meanwhile, according to the embodiment, the capping conductor may be formed of Indium Tin Oxide (ITO).

The capping conductor 400 may be connected to the FOG electrode 800 through Anisotropic Conductive Film (ACF) bonding 600.

The ACF may refer to an anisotropic conductive film.

Various driver IC chips for driving the LED module 110, for example, a power line, a data IC, a gate IC, a touch sensing IC, a wireless controller, a communication IC, etc. may be connected to the FOG electrode 800.

The FOG electrode 800 may be electrically connected to the fan-out interconnections 220F, 250F, 240F, and VssF by the ACF bonding 600.

According to the above structure, the driver IC 900 may be disposed on the rear side of the light emitting surface of the substrate 111.

Meanwhile, at least one light absorbing layer (a black matrix) is provided in the layers described in FIGS. 6A to 6E to improve uniformity of screen output and color separation through pixel separation.

Meanwhile, the embodiments described in FIGS. 6A to 6E are only one embodiment of the disclosure, and the LED module may be implemented in various forms, such as a flip chip LED module and a vertical chip LED module, and there is no limitation in the form of forming LEDs in a LED module.

Figure 7A:
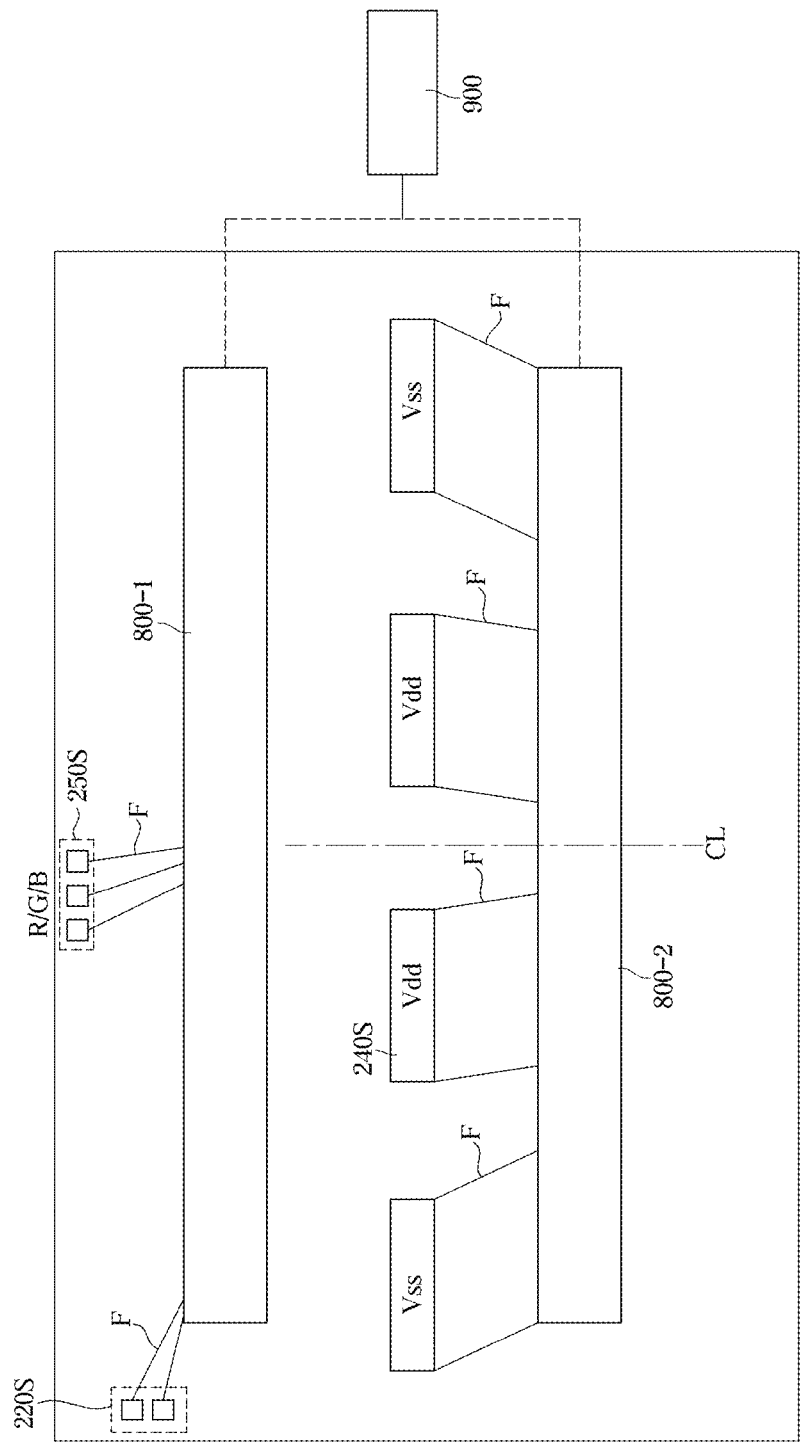
FIG. 7A is a top view of a LED module according to an embodiment.

FIG. 7A are top views of the LED module 110 according to the embodiment.

Referring to FIG. 7A, the fan interconnections F connected to the upper electrodes may be provided on the LED module 110. The fan interconnections may be respectively connected to the upper electrodes 220S, 250S, 240S, and Vss respectively connected to the gate electrode, the signal electrode, the power electrode, and the reference voltage electrode Vss.

Meanwhile, the upper electrodes may be connected to FOG electrodes 800-1 and 800-2 through the fan interconnections. Meanwhile, according to an embodiment, the electrodes 220S and 250S involved in signal transmission of the LED may be connected to a FOG electrode different from a FOG electrode to which the upper electrodes Vss and 240S involved in power supply are connected.

In detail, the gate electrode and the signal electrode may be connected to the upper electrodes 220S and 250S so as to be connected to the signal FOG electrode 800-1 through a fan-out interconnection F.

In addition, the power voltage electrode and the reference voltage electrode may be connected to the upper electrodes 240S and Vss so as to be connected to the power FOG electrode 800-2 through another fan-out interconnection F.

Meanwhile, referring to FIG. 7B, the upper electrodes 220S and 250S involved in signal transmission of the LED and the upper electrodes Vss and 240S involved in power supply may be connected to the same FOG electrode 800.

In addition, according to an embodiment, fan-out interconnections connected to the power voltage electrode and the reference voltage electrode at one side may be symmetrical to those connected to the power voltage electrode and the reference voltage electrode at another side with respect to a center line CL of the FOG electrode.

With such a connection, the LED module may supply power from the center of the panel using the above-described FOG electrode to provide a uniform radial luminance distribution.

As is apparent from the above, the LED module, the display device, and the method of manufacturing the display device can provide freedom to structure design of the LED module using a fan out interconnection and an insulating layer.

The display module according to the disclosure can be solely installed to use for wearable devices, portable devices, handheld devices, and various electronic products and machine parts that require display, and can be assembled in a matrix form and installed to use for display devices, such as monitors for PCs, high-resolution TVs, signage (electronic displays), and the like.

Although exemplary embodiments of the present disclosure have been described for illustrative purposes, those skilled in the art will appreciate that various modifications, additions and substitutions are possible, without departing from the scope and spirit of the disclosure. Therefore, exemplary embodiments of the present disclosure have not been described for limiting purposes.

What is claimed is:
1. A light emitting diode (LED) module having a multi-layer structure, the LED module comprising:
  a substrate;
  a LED on the substrate, the LED configured to emit light toward the substrate;
  a plurality of upper electrodes on the LED and connected to the LED;
  an upper insulating layer surrounding the plurality of upper electrodes;
  a film on glass (FOG) electrode on the upper insulating layer;
  a fan out interconnection structure configured to connect the plurality of upper electrodes to the FOG electrode through the upper insulating layer;

a metal capping layer provided between the FOG electrode and the fan out interconnection structure; and
a thin film transistor (TFT) provided on the substrate and having a gate electrode,
wherein a length of the FOG electrode extending in a first direction along an upper surface of the upper insulating layer is longer than a width of the FOG electrode extending in a second direction along the upper surface of the upper insulating layer, the second direction being perpendicular to the first direction,
wherein the plurality of upper electrodes comprise a first upper electrode connected to a signal electrode and a second upper electrode connected to the gate electrode, the signal electrode provided to supply a data signal to the LED, and
wherein the FOG electrode connects the first and the second upper electrodes respectively connected to the signal electrode and the gate electrode to be connected to the FOG electrode through the fan out interconnection structure.

2. The LED module of claim 1, wherein the upper insulating layer is formed of a first layer different from a second layer on which the LED is mounted.

3. The LED module of claim 1, wherein the upper insulating layer is provided between the FOG electrode and the LED to protect the LED.

4. The LED module of claim 1, wherein the upper insulating layer comprises via holes corresponding to the plurality of upper electrodes.

5. The LED module of claim 1, wherein the fan out interconnection structure is formed separate from an interconnection structure connected to the LED.

6. The LED module of claim 1, wherein the plurality of upper electrodes comprise a third upper electrode connected to a power voltage electrode that supplies power to the LED and a fourth upper electrode connected to a reference voltage electrode connected to a cathode of the LED,
wherein the FOG electrode connects the third and the fourth upper electrodes respectively connected to the power voltage electrode and the reference voltage electrode to be connected to the FOG electrode through the fan out interconnection structure.

7. The LED module of claim 6, wherein the fan out interconnection structure respectively connected to the power voltage electrode and the reference voltage electrode form a symmetric structure with respect to the FOG electrode.

8. The LED module of claim 1, further comprises:
another insulating layer provided on the upper insulating layer and the fan out interconnection structure.

9. A display device comprising:
a light emitting diode (LED) module having a multi-layer structure;
a driver integrated chip (IC) configured to drive the LED module;
a film on glass (FOG) electrode located on the LED module and configured to be connected to the driver IC; and
a controller configured to supply power to the LED module through the driver IC,
wherein the LED module includes:
a substrate;
a LED on the substrate, the LED configured to emit light toward the substrate;
a plurality of upper electrodes on the LED and connected to the LED;
an upper insulating layer surrounding the plurality of upper electrodes;
a film on glass (FOG) electrode on the upper insulating layer; and
a fan out interconnection structure configured to connect the plurality of upper electrodes to the FOG electrode through the upper insulating layer.

10. The display device of claim 9, wherein the upper insulating layer is formed of a first layer different from a second layer on which the LED is mounted.

11. The display device of claim 9, wherein the upper insulating layer is provided between the FOG electrode and the LED to protect the LED.

12. The display device of claim 9, wherein the upper insulating layer comprises via holes corresponding to the plurality of upper electrodes.

13. The display device of claim 9, wherein the fan out interconnection structure is formed separate from an interconnection structure connected to the LED.

14. The display device of claim 9, further comprising a thin film transistor (TFT) disposed on the substrate and having a gate electrode,
wherein the plurality of upper electrodes comprise a first upper electrode connected to a signal electrode and a second upper electrode connected to the gate electrode, the signal electrode provided to supply a data signal to the LED, and
wherein the FOG electrode connects the first and the second upper electrodes respectively connected to the signal electrode and the gate electrode to be connected to the FOG electrode through the fan out interconnection structure.

15. The display device of claim 9, wherein the plurality of upper electrodes comprise a third upper electrode connected to a power voltage electrode that supplies power to the LED and a fourth upper electrode connected to a reference voltage electrode connected to a cathode of the LED,
wherein the FOG electrode connects the third and the fourth upper electrodes respectively connected to the power voltage electrode and the reference voltage electrode to be connected to the FOG electrode through the fan out interconnection structure.

16. The display device of claim 15, wherein the fan out interconnection structure respectively connected to the power voltage electrode and the reference voltage electrode form a symmetric structure with respect to the FOG electrode.

17. The display device of claim 9, wherein the fan out interconnection structure form a symmetric structure with respect to the FOG electrode,
wherein the driver IC supplies power to the LED through the FOG electrode.

18. The display device of claim 17, wherein the plurality of upper electrodes comprise a third upper electrode connected to a power voltage electrode and a fourth upper electrode connected to a reference voltage electrode, and
wherein the FOG electrode connects the third and the fourth upper electrodes respectively connected to the power voltage electrode and the reference voltage electrode to be connected to the FOG electrode through the fan out interconnection structure.

19. The display device of claim 17, wherein the driver IC supplies power to the LED in a substantially uniform manner through the fan out interconnection structure.

20. A light emitting diode (LED) module comprising:
a substrate;
a first insulating layer on the substrate;

a light emitting diode (LED) on the first insulating layer;
a second insulating layer on the first insulating layer and surrounding the LED;
a plurality of upper electrodes on the second insulating layer and connected to the LED;
an upper insulating layer on the second insulating layer and surrounding the plurality of upper electrodes;
a third insulating layer on the upper insulating layer;
a film on glass (FOG) electrode on the third insulating layer; and
a fan out interconnection structure configured to connect the plurality of upper electrodes to the FOG electrode through the upper insulating layer.

* * * * *